United States Patent [19]

Landman

[11] 3,868,515

[45] Feb. 25, 1975

[54] JOSEPHSON DEVICE THRESHOLD GATES

[75] Inventor: Bernard S. Landman, Yorktown Heights, N.Y.

[73] Assignee: International Business Machines Corporation, Armonk, N.Y.

[22] Filed: Dec. 29, 1972

[21] Appl. No.: 319,811

[52] U.S. Cl. .................. 307/212, 307/245, 307/306, 357/5

[51] Int. Cl.... H03k 19/02, H03k 19/20, H03k 3/38

[58] Field of Search ........... 307/212, 245, 277, 306; 317/234 T

[56] References Cited

UNITED STATES PATENTS

| | | | |
|---|---|---|---|
| 3,365,584 | 1/1968 | Bragg | 307/212 X |
| 3,458,735 | 7/1969 | Fiske | 307/306 X |
| 3,521,133 | 7/1970 | Beam | 317/234 T |

*Primary Examiner*—Andrew J. James
*Assistant Examiner*—William D. Larkins
*Attorney, Agent, or Firm*—Sughrue, Rothwell, Mion, Zinn & Macpeak

[57] ABSTRACT

Threshold logic gates are provided using Josephson devices to perform the weighting and threshold functions. The input currents are provided as control currents to vary the critical switching currents of respective series connected Josephson devices. A logic 1 input switches the associated Josephson device or devices from the $V = 0$ state to the $V = \Delta$ state. An alternate parallel path is provided. The alternate path carries a current which is effectively the sum of the weighted logic inputs. A further Josephson device is positioned to be influenced by the current in said alternate path whereby the further Josephson device switches from the $V = 0$ state to the $V = \Delta$ state when the threshold function is achieved.

6 Claims, 7 Drawing Figures

JOSEPHSON DEVICE THRESHOLD GATES

BACKGROUND OF THE INVENTION

This invention is in the field of threshold logic gates, and more particularly pertains to threshold logic gates using Josephson devices.

In an article entitled "Threshold Logic" by Daniel Hampel and Robert Widner, published in IEEE Spectrum, May, 1971, pp. 32–39, threshold logic gates and means for implementing such gates with large scale integrated circuitry are disclosed. As pointed out in the article, threshold logic gates have increased logic power over standard Boolean logic gates such as AND, OR, NOR gates. Basically, a threshold logic gate receives n logic inputs, weights the n inputs either equally or with unequal weights, sums the weighted inputs, and provides a logic output if the sum is greater than or equal to a threshold weighting factor.

As a simple example consider the threshold logic gate having three logic inputs $A$, $B$ and $C$, weights of value 1, applied to each input, and a threshold weight factor, $T$, which is equal to 2. The threshold gate provides the logic function, $$F(A,B,C) = A{\cdot}B + B{\cdot}C + A{\cdot}C.$$

Conventional threshold logic is implemented by using either current sources and a threshold detector, or by magnetic flux summing techniques. Current summing techinques require integrated circuitry with several diffused transistors and resistors of precise values. Magnetic flux summing techniques use magnetic cores which have several control windings, each with an appropriate, and therefore precise, number of turns thereon. The number of turns determines the weighting function while the threshold of the device is determined by the hysteresis characteristics of the magnetic cores. Threshold logic using cores requires large areas and is slow in logic speed.

The present invention makes use of Josephson devices (devices which exhibit the d.c. Josephson effect) to implement threshold logic gates. As is well known, a Josephson device, such as a junction formed by two superconductors having a tunnelling oxide between them, exhibits an $I-V$ characteristic such that the voltage across the junction remains at zero until the current reaches a critical value $I_m$, at which time the voltage across the device jumps to a finite value, Δ, and thereafter varies slowly with further increase in current. Also the critical value $I_m$ is dependent upon the magnetic field applied to the Josephson device.

Current summing techniques and magnetic flux summing techniques require precision in generating the analog quantity which will be compared to the threshold. Precision is also required when Josephson devices are used. The source of analog precision is provided in the Josephson case by voltage referred to above as Δ. The parameter Δ is essentially the gap in the energy spectrum of the conduction electrons of the superconductor being considered and as such is a material constant.

It is known to provide switching devices which make use of the above mentioned characteristics. For example, a current $I_g$, known as the gating current, is applied to a Josephson device having a resistance, $R$, connected in parallel therewith. A further current carrying line is provided overlaying the Josephson device. The control current, $I_c$, through the latter line controls the magnetic field and therefore controls the critical current $I_m$. The current values are selected so that when $I_c$ has a first value, e.g., $I_c = 0$, the critical current $I_m$ is greater than $I_g$ and thus the voltage is zero and no current flows through the parallel resistor. When $I_c$ has a second value, e.g., $I_c \neq 0$, the critical current $I_m$ is now less than the constant value $I_g$ causing the voltage across the junction to be finite. The finite voltage causes a current to flow through the parallel resistor.

SUMMARY OF THE INVENTION

In accordance with the present invention, threshold logic gates are provided using Josephson devices.

The logic inputs to the threshold gate are applied as control currents to respective Josephson devices arranged in series circuit. The number of Jospehson devices which an individual input control line overlays determines the weighting function for the particular logic input. An alternate path including a resistance is provided in parallel with the series connected Josephson devices. A current $I_1$ is applied to the series connection and is selected so that it exceeds the critical current $I_m$ of any of the Josephson devices if and only if a logic 1 current is applied to the control line overlaying said Josephson devices.

The total voltage across the series connection, and therefore the current through the alternate path is dependent upon the number of Josephson devices which have switched to the $V = \Delta$ state. This current, which is $m\ \Delta/R$ represents the summation function of the threshold logic, where Δ is the non-zero voltage of the switched Josephson devices, $m$ is the number of Josephson devices which have switched to the $V = \Delta$ state, and $R$ is the impedance of the alternate path.

The threshold function of the threshold logic gate is provided by using the alternate path as a control line overlaying a further Josephson device. The threshold value is set by current $I_2$ applied to the further Josephson device. The current ]$I_2$ establishes a value of $I_m$ for further Josephson device. A logic 1 output, corresponding to a voltage $V \neq 0$ across said further device, occurs only when the current in the alternate path $M\Delta$, /]$R$ equals or exceeds the value $I_m$.

DETAILED DESCRIPTION

Figure 1:
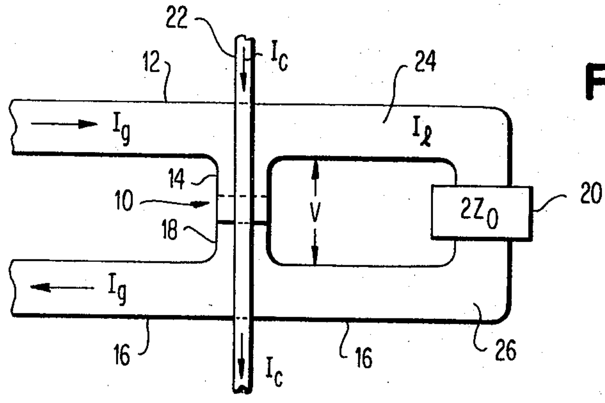
FIG. 1 shows a typical Josephson device.

Various types of Josephson devices are well known in the art. In accordance with the present invention the particular type of Josephson device used is not the critical feature. The important feature of the device is the characteristic it exhibits, said characteristic being common to Josephson devices.

One particular type of Josephson device, shown here by way of example only, is a junction device comprising two superconducting metals separated by a thin layer of tunnelling oxide. Typically, the oxide is an oxide of the superconducting metal.

FIG. I illustrates a top view of one construction of a Josephson junction device. The junction device 10 is included in a switching circuit arrangement. The entire device shown in FIG. 1 overlies a substrate which, in turn overlies a ground plane, not shown. A first superconducting metal layer 16, having the shape illustrated, is laid down on the substrate. A second superconducting metal 12 is also laid down on the substrate, but a portion 14, thereof, overlies a portion 18 of superconductor 16. The overlapping portions of the superconductors are separated by a tunnelling oxide and form a Josephson junction device. The parallel superconducting path includes a resistance 20.

A current $I_g$ applied to the circuit will flow only through the junction provided $I_g$ is less than the critical current $I_m$. Under this condition the voltage across the junction is zero volts and thus no current flows in the parallel path comprising leg portions 24 and 26 and resistor 20.

Figure 2:
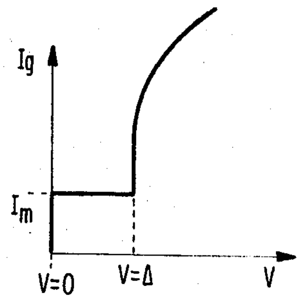
FIG. 2 is a graph showing the $I-V$ characteristic of a typical Josephson device.
Figure 3:
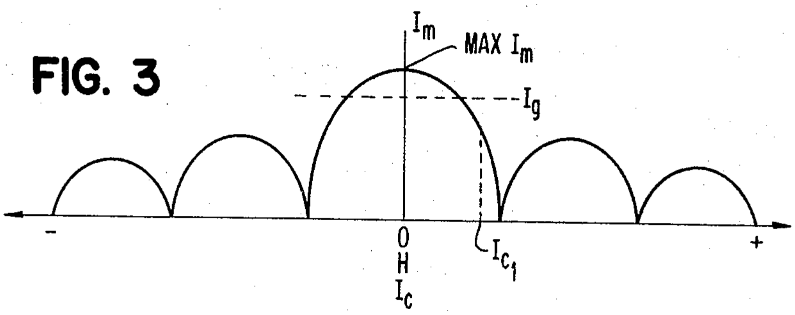
FIG. 3 is a graph illustrating the relation between critical current $I_m$ and magnetic field $H$ for a typical Josephson device.

The d.c. $I-V$ characteristic of a Josephson device is illustrated in FIG. 2. As can be seen, as the gate current increases the voltage remains at zero until the critical current $I_m$ is reached. When $I_m$ is reached the voltage across the junction becomes equal to some value $\Delta$ which is not zero. The critical current $I_m$ is dependent upon the magnetic field $H$ applied to the Josephson device. A curve of $I_m$ versus $H$ is illustrated in FIG. 3. The maximum $I_m$ occurs at 0 magnetic field.

A typical method of controlling H is to provide a conducting strip 22 overlying and insulated from junction 10. The current $I_c$, through strip 22, can be plotted versus $I_m$ and will result in substantially the same curve as shown in FIG. 3.

As will be appreciated from FIGS. 1,2 and 3, if $I_g$ is set at the value shown by the dashed line in FIG. 3, switching of the junction device between V = 0 and V = $\Delta$, can be accomplished by changing $I_c$ from 0 to $I_{cl}$. When $I_c = 0$, the critical current $I_m$ will be greater than $I_g$. Consequently $V = 0$ and no current flows through resistance 20. When $I_c$ is made equal to $I_{cl}$, the critical current $I_m$ is reduced to a value less than $I_g$. Since $I_g$ now exceeds the critical current, $V = \Delta$ and the current which flows through the alternate path including resistance 20, is $I_1 = \Delta/R$, where $R$ is the resistance.

Arms 24 and 26 of superconductors 12 and 16 form transmission lines with the ground plane and each has a characteristic impedance $Z_o$ with respect to the ground plane. It is preferable to make resistance 20 equal to the characteristic impedance of the network connected to it, which in this case would be $2Z_o$.

Figure 4:
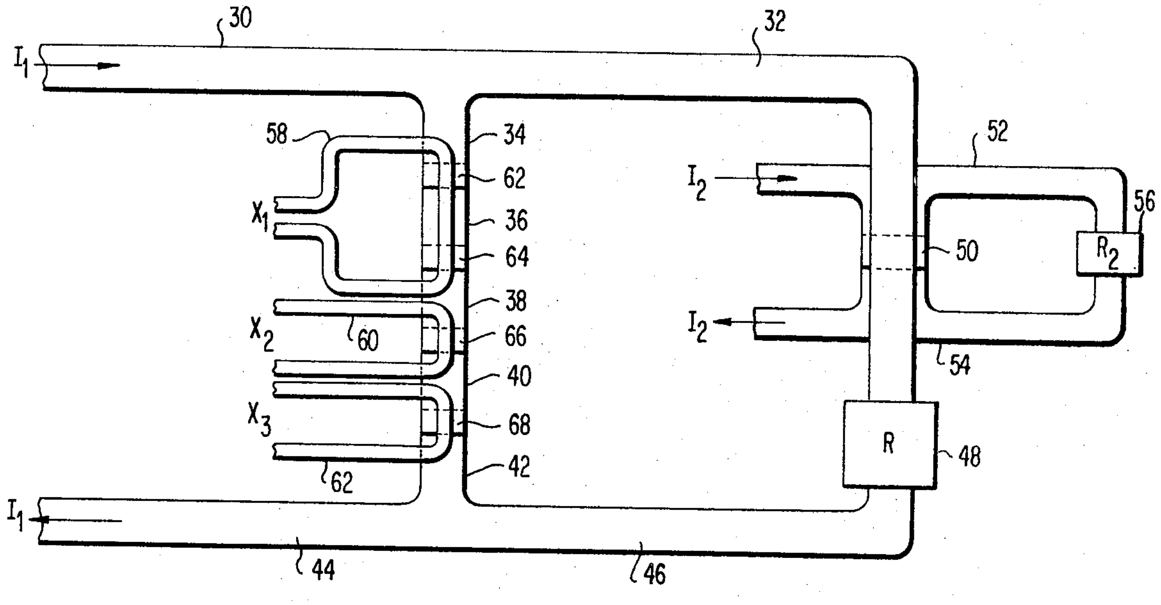
FIG. 4 is a top view of a threshold logic circuit in accordance with the present invention.

The above characteristics of Josephson devices can be used to form threshold logic circuits. One example of such a threshold logic circuit is illustrated in FIG. 4. The logic function implemented by FIG. 4 is $$F(X_1, X_2, X_3) = X_1 + X_2 \cdot X_3.$$

Figures 5, 5A, 6:
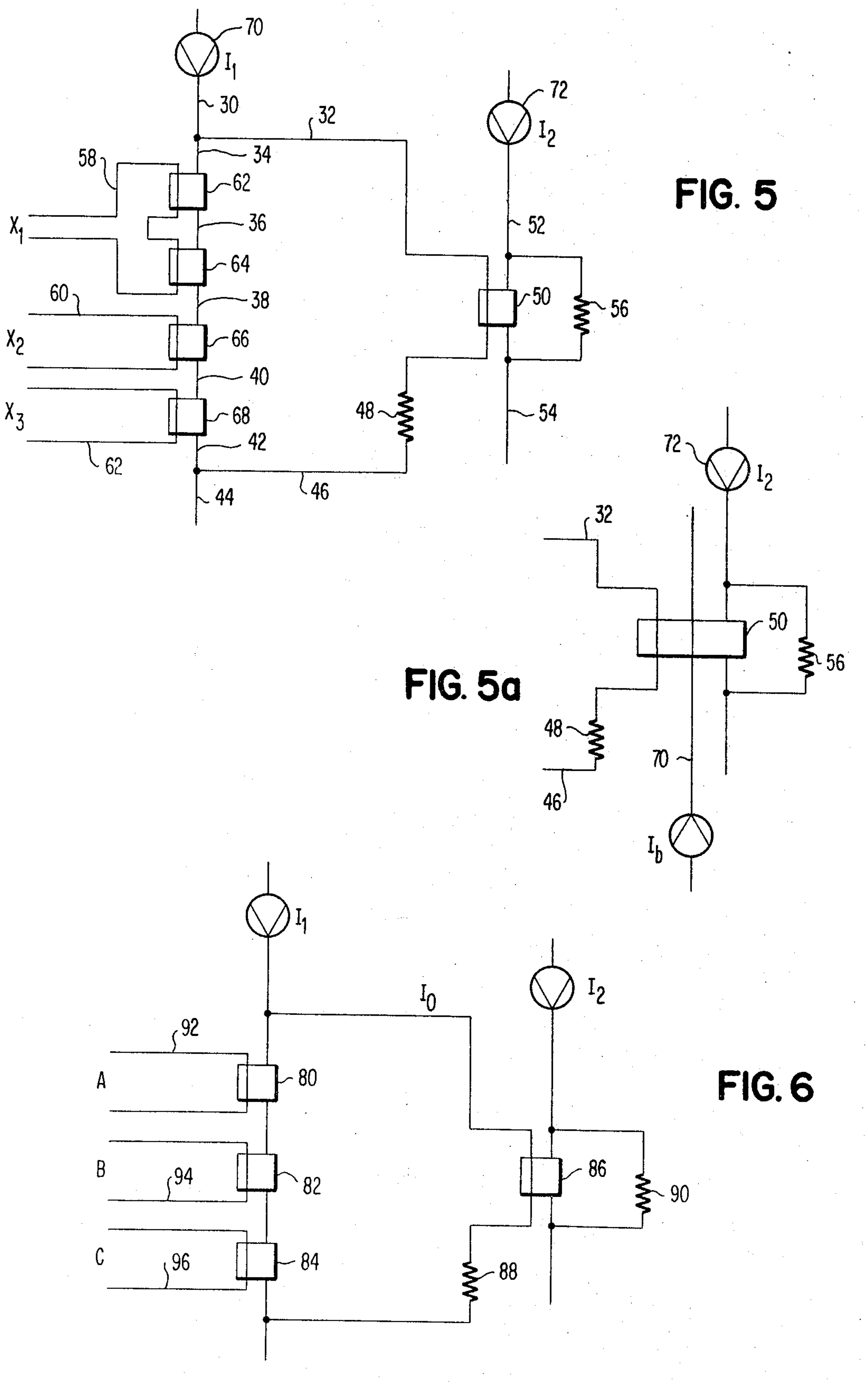
FIG. 5 is a schematic diagram of the threshold logic circuit of FIG. 4.
FIG. 5*a* is a schematic diagram illustrating a modification of FIG. 5.
FIG. 6 is a schematic diagram of a second example of a threshold logic circuit in accordance with the present invention.

The logic inputs are $X_1$, $X_2$ and $X_3$. Inputs $X_2$ and $X_3$ are given weights of 1, whereas input $X_1$ is given a weight of 2. The threshold is set at $1<T<2$ or $T \cong 1.5$. The weighting and summing portion of the threshold logic circuit comprises Josephson junctions 62, 64, 66 and 68, superconductor gate current path 30 and 44, junction forming superconducting portions 34, 36, 40 and 42, alternate parallel path 32 and 46 and resistor 48. The input portion of the threshold gate comprises control lines 58, 60 and 62, to which currents $I_c = 0$ and $I_c = {}_{Icl}$ are applied, corresponding to logic 0 and logic 1 respectively. it will be appreciated that two non-zero currents can be provided as the logic 0 and logic 1 inputs, but for the purpose of simplifying the explanation 0 and $I_{cl}$ currents will be assumed as the logic 0 and logic 1 inputs.

the threshold portion of the threshold gates comprises, Josephson device 50, superconductor 52 and 54, and resistor 56. The entire structure can be fabricated in accordance with known techniques. A schematic diagram of the circuit of FIG. 4 is illustrated in FIG. 5 wherein the same numerals are used to designate the corresponding elements.

An $I_1$ current source 70 is provided to supply a gating current to Josephson devices 62, 64, 66 and 68. The value $I_1$ is selected so that it is less than $I_m$ when $I_c$ = 0 and is above $I_m$ when $I_c = I_{cl}$. Control line 58 is provided across Josephson devices 62 and 64 thereby giving the $X_1$ input a weight of two. For example, if $X_1$ is a logic 1 and $X_2$ and $X_3$ are both logic 0, Josephson devices 62 and 64 will be in the $V = \Delta$ states whereas Josephson devices 66 and 68 will be in their $V = 0$ states. Control lines 60 and 62 are provided across Josephson devices 66 and 68 respectively.

A truth table for the first portion of the circuit is illustrated below, where $E$ is the voltage across resistor 48 and $I_o$ in the current through the alternate path.

| $X_1$ | $X_2$ | $X_3$ | E | $I_o$ |
|---|---|---|---|---|
| 0 | 0 | 0 | 0 | 0 |
| 1 | 0 | 0 | 2 Δ | 2Δ/R |
| 0 | 1 | 0 | 1 Δ | Δ/R |
| 1 | 1 | 0 | 3 Δ | 3Δ/R |
| 0 | 0 | 1 | 1 Δ | Δ/R |
| 1 | 0 | 1 | 3 Δ | 3Δ/R |
| 0 | 1 | 1 | 2 Δ | 2Δ/R |
| 1 | 1 | 1 | 4 Δ | 4Δ/R |

As will be appreciated, the current $i_o$ represents the summation function of the threshold gate. The path 32, 46 which carries current $I_o$ overlies Josephson device 50 and consequently influences the critical current $I_m$ of device 50. A current source 72 provides a gating current $I_2$ to device 50. Current $I_2$ is selected, in this example, to have a value less than $I_m$ when $I_o < 2\Delta/R$ and greater than $I_m$ when $I_o$ $2\Delta/R$.

Under these conditions, when two or more of devices 62, 64, 66 and 68 are in the $V = \Delta$ state, the summation current will be equal to or greater than $2\Delta/R$. Josephson device 50 will be in the $V = \Delta$ state causing current to flow through resistor 56. The latter current represents a logic 1 output.

When one or none of the devices 62–68 are in the $V = \Delta$ state (a condition caused by any of the logic input combinations $\bar{X}_1 \bar{X}_2 \bar{X}_3$, $\bar{X}_1 \bar{X}_2 X_3$, or $\bar{X}_1 X_2 \bar{X}_3$) the summation current $I_o$ will be less than $2\Delta/R$. Device 50 will be in the $V = 0$ state and no current will flow through resistor 56. This corresponds to a logic 0 output.

As will be appreciated the threshold function of the circuit can be changed by changing $I_2$. Also, resistors 48 and 56 are preferably the characteristic impedances of the circuit, but that is not a necessity. It will further be appreciated that any threshold logic gate can be made in accordance with the above techniques. A generalized gate has n inputs, each input being assigned a weight by the number of Josephson devices asssociated with that input.

The threshold portion of the threshold gate of FIG. 5 can be modified as illustrated in FIG. 5*a* by providing a bias control current $I_b$ on control line 70 which overlies device 50. in this case the net downward control current is $i_o - I_b$. If $I_2$ is selected so that device 50 switches to $V = \Delta$ when the control current in a downward direction is greater than or equal to $\Delta/R$, and $I_b = \Delta/R$ the same result as in FIG. 5 will be achieved.

A particular subcategory of threshold logic gates is in the $m$ out of n gate. In this type of gate, n inputs are weighted equally and the gate provides a logic 1 output when m or more of the n inputs are logic 1. An example of this type of gate where $n = 3$ and $m = 2$ is illustrated in FIG. 6 Logic inputs $A$, $B$, and $C$ are connected to control conductors 92, 94 and 96, respectively, which overlie Josephson devices 80, 82 and 84, respectively. $I_1$ is selected to cause the Josephson devices 80, 82 and 84 to switch to $V = \Delta$ when the respective inputs are logic 1. Current $I_2$ is selected to cause Josephson device 86 to switch to $V = \Delta$ when $I_o$ is equal to or above $2\Delta/R$. The logic function provided is, $$F(A, B, C) = A{\cdot}B + B{\cdot}C + A{\cdot}C.$$

What is claimed is :

1. A threshold logic gate of the type having n inputs, weighting means for each of said inputs, summing means and threshold means, the improvement comprising:

a. a plurality of series connected Josephson devices of the type which have zero voltage there-across when the current therethrough is below a critical current and a finite well-defined voltage, Δ, there-across, when the current equals or exceeds the critical current, b. input control lines each associated with specific ones of said series connected Josephson devices and positioned to provide a magnetic field to change the critical current of said specific ones of said devices, c. means for applying a gating current to said series connected Josephson devices, said gating current having a Josephson between the critical current values which would be established by first and second current values applies to any of said input control lines, wherein each said input control line is adapted to carry a logic 0 current of value $I_{c_0}$ and a logic 1 current of value $I_{c_1}$, where $I_{c_0} \neq I_{c_1}$, and wherein said currents $I_{c_0}$ and $I_{c_1}$ cause the specific Josephson devices associated with said control lines to have critical currents of $I_{m_0}$ and $I_{m_1}$, respectively, $I_{m_0} \neq I_{m_1}$, and wherein said gating current applied to said series connected Josephson devices has a value $I_1$ which is less than $I_{m_0}$ and equal to or greater than $I_{m_1}$, wherein the voltage across said series connected Josephson devices equals $m\Delta$, where Δ is the voltage across an individual Josephson device which has been switched from $V=0$ to $V \neq 0$, and where m is the number of said series connected Josephson devices associated with input control lines carrying currents of value $I_{c_1}$, d. a resistance, R, connected in a current path in parallel with said series connected devices, e. a further Josephson device positioned to be influenced by the magnetic field caused by current flowing in said parallel current path, f. means for applying a gating current to said further Josephson device whereby the switching of said further Josephson device from a zero voltage depends upon the current value in said alternate path, and g. means electromagnetically coupled to said further Josephson device for varying the threshold of said threshold logic gate and thereby altering the logic function carried out by said threshold logic gate.

2. A threshold gate as claimed in claim 1 wherein said means for varying comprises an additional current carrying path overlying and insulated from said further Josephson device for influencing the magnetic field value applied to said further Josephson device.

3. A threshold gate as claimed in claim 2 wherein said current path having resistance R connected therein comprises a first arm of said current path extending between one end of said series connection of Josephson devices and one end of said resistance R, and a second arm of said current path extending between the other end of said series connection and the other end of said resistance R, and further wherein said resistance R is equal to twice the characteristic impedance of each said arm of said current path.

4. A threshold gate as claimed in claim 2 wherein said Josephson devices are Josephson junctions comprising a first superconducting material, a thin tunnelling oxide on said first superconducting material, and a second superconducting material on said tunnelling oxide.

5. A threshold gate as claimed in claim 2 wherein said gate further comprises a further alternate parallel current carrying path in parallel with said further Josephson device, said further parallel path including a resistance.

6. A threshold gate as claimed in claim 2 wherein there are n input control lines and n series connected Josephson devices, said n control lines overlying and insulated from respective ones of said n Josephson devices.

* * * * *

UNITED STATES PATENT OFFICE

CERTIFICATE OF CORRECTION

PATENT NO. : 3,868,515

DATED : February 25, 1975

INVENTOR(S) : BERNARD S. LANDMAN

It is certified that error appears in the above-identified patent and that said Letters Patent are hereby corrected as shown below:

IN THE SPECIFICATION:

Column 2 - Line 40, before "$I_2$" delete "]"

Line 40, after "for" insert --the--

Line 44, delete "/]R" and insert --/R--

Column 3 - Line 8, delete "FIG. I" and insert --FIG. 1--

Column 4 - Line 3, after "36," insert --38,--

Line 13, delete "the" and insert --The--

Line 45, delete "$i_0$" and insert --$I_0$--

Line 53, delete "$I_0$ 2Δ/R" and insert --$I_0 \geq 2\Delta R$--

Column 5 - Line 10, delete "in" and insert --In--

Line 14, before "the" insert --,--

Line 15, delete "in"

IN THE CLAIMS:

Column 5 - Line 48, delete "Josephson" and insert --value--

Line 50, delete "applies" and insert --applied--

Signed and sealed this 17th day of June 1975.

(SEAL)
Attest:

RUTH C. MASON
Attesting Officer

C. MARSHALL DANN
Commissioner of Patents
and Trademarks